(12) United States Patent
Heinze et al.

(10) Patent No.: US 7,821,357 B2
(45) Date of Patent: Oct. 26, 2010

(54) FILTER ASSEMBLY COMPRISING TWO BULK WAVE RESONATORS

(75) Inventors: Habbo Heinze, Munich (DE); Jürgen Kiwitt, Munich (DE); Edgar Schmidhammer, Stein (DE); Pasi Tikka, Unterhaching (DE); Reiner Welzer, Munich (DE)

(73) Assignee: Epcos AG, Munich (DE)

( * ) Notice: Subject to any disclaimer, the term of this patent is extended or adjusted under 35 U.S.C. 154(b) by 551 days.

(21) Appl. No.: 11/659,161

(22) PCT Filed: Jun. 8, 2005

(86) PCT No.: PCT/EP2005/006163

§ 371 (c)(1),
(2), (4) Date: Jan. 8, 2008

(87) PCT Pub. No.: WO2006/015640

PCT Pub. Date: Feb. 16, 2006

(65) Prior Publication Data

US 2008/0246556 A1 Oct. 9, 2008

(30) Foreign Application Priority Data

Aug. 4, 2004 (DE) ........................ 10 2004 037 818

(51) Int. Cl.
H03H 9/54 (2006.01)
H03H 9/70 (2006.01)

(52) U.S. Cl. ...................................... 333/133; 333/189

(58) Field of Classification Search ......... 333/187–192, 333/133

See application file for complete search history.

(56) References Cited

U.S. PATENT DOCUMENTS

| 6,927,649 | B2 * | 8/2005 | Metzger et al. | 333/133 |
| 6,965,281 | B2 * | 11/2005 | Sunwoo et al. | 333/133 |
| 6,985,052 | B2 * | 1/2006 | Tikka | 333/189 |
| 6,992,400 | B2 * | 1/2006 | Tikka et al. | 257/787 |
| 7,094,626 | B2 * | 8/2006 | Stelzl et al. | 438/106 |
| 7,385,467 | B2 * | 6/2008 | Stoemmer et al. | 333/189 |
| 2006/0151203 | A1 | 7/2006 | Krueger et al. | |

FOREIGN PATENT DOCUMENTS

| DE | 102 38 523 | | 3/2004 |
| DE | 102 39 317 | A1 * | 3/2004 |
| EP | 1 263 137 | | 12/2002 |
| WO | WO 03/032484 | A1 * | 4/2003 |

OTHER PUBLICATIONS

Written Opinion for PCT/EP2005/006163, mailed Sep. 2005.
International Search Report for PCT/EP2005/006163, mailed Sep. 2005.
Translation of Written Opinion for PCT/EP2005/006163, mailed Sep. 2005.

* cited by examiner

*Primary Examiner*—Barbara Summons
(74) *Attorney, Agent, or Firm*—Fish & Richardson P.C.

(57) ABSTRACT

An arrangement includes a substrate, a filter, a first bulk acoustic wave resonator, a second bulk acoustic wave resonator, and a large surface covering. The first bulk acoustic wave resonator includes a first electrode and a second electrode and is arranged flatly on the substrate. The second bulk acoustic wave resonator includes a first electrode and a second electrode and is arranged flatly on the substrate. The large-surface covering includes a metal layer over the substrate. The metal layer is connected to a ground terminal.

13 Claims, 3 Drawing Sheets

FILTER ASSEMBLY COMPRISING TWO BULK WAVE RESONATORS

TECHNICAL FIELD

A filter arrangement is disclosed. In particular, an arrangement of at least one HF filter that can be used as an input or output filter in the front end of a wireless communication device is disclosed.

BACKGROUND

The invention relates to a filter arrangement, in particular, an arrangement of at least one HF filter that can be used as an input or output filter in the front end of a wireless communication device.

Various types of filters and filter arrangements based on different physical principles are known. One of these is filters that operate with bulk acoustic wave resonators. Because of their small space requirements, the possibility of manufacturing them on an integrated basis and the filter properties that can be achieved with them, bulk acoustic wave resonators for mobile applications are usually constructed as FBAR filters. An FBAR filter comprises at least two flat bulk acoustic wave resonators, which are arranged with an electrode flatly on a substrate. Several resonators can be arranged one above another, but preferably side by side, and connected to one another in an integrated manner via structuring. A functional filter is obtained by connecting several FBAR resonators, with ladder-type and lattice-type arrangements being known.

The electrical contacting of such components and the integration of additional circuit components is preferably done by mounting the substrate, e.g., a silicon substrate, carrying the FBAR resonators in a flip-chip arrangement on the upper side of a carrier, wherein the external contacts of the finished component are realized on the underside of the carrier. These can be connected via through-hole contacts to the contact surfaces present on the surface. For a multilayer carrier, which comprises two or more dielectric layers between which metallization planes are arranged, one can integrate additional passive circuit components in the carrier by structuring the metallization planes.

For protection against environmental influences, particularly moisture and mechanical damage, the component, without an additional housing, can be provided with a covering produced by laminating a protective film that lies tightly against the back side of the carrier and on the upper side of the carrier. A particularly hermetically sealing covering is obtained if a metal film is applied to the upper side of the film covering.

The disadvantageous aspect of such hermetic coverings coated with a metal film is the small distance of this covering from the flatly formed electrodes of FBAR resonators or bulk acoustic wave resonators in general. Considerable parasitic capacitances, which adversely affect the component, can thereby be formed between the electrodes and the metal film of the covering by intervening covering films and the chip substrate, which act as a dielectric. Because of this capacitive coupling, different FBAR resonators are capacitively coupled to one another, which further degrades the filter properties.

Filter arrangements also exist in which two filters are realized on one substrate or on separated ones and also arranged on a common substrate and covered with a common covering. In such an arrangement, there can be a capacitive coupling of the two otherwise separated filters, i.e., so-called crosstalk appears. If the two filters form a duplexer, then the isolation between the transmit path (TX path) and the receive path (RX path) is impaired and reduced by the capacitive coupling and the crosstalk caused thereby.

An increased scattering of high-frequency transmit signal power into the receive path leads to an increase in the noise level, which implies a loss of dynamic range in the preamp stage, even to the point of saturation. This can be compensated only to a limited extent by lower-noise preamps (LNA) with higher linearity (IIP3 point), which are expensive, however, and display other technical disadvantages, such as increased power consumption. Beyond a certain increase in the noise level, the interference is no longer acceptable, if the sensitivity of the receiver no longer suffices even for reception of nearby base stations.

For CDMA mobile telephone systems, such scattering also leads to higher requirements for the suppression of intermodulation products in the digital baseband filtering in the receive path. These intermodulation products arise by conversion of external interference signals at the nonlinear power amplification stage in the transmit path, and lie in the so-called fly-back region at a multiple of the transmission frequency.

For the solution of this problem, it was already proposed to connect the metal film of the covering to a ground terminal and thereby reduce the capacitive coupling. The starting point here was the assumption that as many shunt connections to ground as possible improve the effect.

It was shown, however, that the component properties are not substantially improved in this manner, and that the capacitive coupling of different bulk acoustic wave resonators in a filter arrangement still appears and degrades filter performance.

SUMMARY

A filter arrangement with at least two bulk acoustic wave resonators in which the negative effects of capacitive crosstalk are reduced is disclosed.

This problem is solved according to the invention by a filter arrangement with the characteristics of claim 1. Advantageous configurations of the invention can be deduced from the additional claims.

A filter arrangement comprises at least one filter and at least two bulk acoustic wave resonators. The bulk acoustic wave resonators are arranged with their electrodes flat on a dielectric or semiconductive substrate. A large surface covering that comprises a metal film is arranged on the substrate and preferably covers its rear side. To reduce the capacitive coupling between the two or more bulk acoustic wave resonators or their electrodes, an electrical connection of the metal film to the ground terminal of the filter arrangement is provided, wherein a series inductor is formed in the connection.

While it was previously sought to configure this connection of such a metal film to ground so as not to be inductive at all, and to realize this particularly by providing a plurality of such connections, in some embodiments disclosed herein the inductance is raised to a specific level. The value of the inductance here is markedly above that which is achieved in a normal electrical connection of the metal film to the ground terminal of the filter arrangement.

With such an arrangement one can succeed in connecting an additional resonant circuit to ground, with the aid of which signals in the corresponding resonant frequency range can be diverted to ground. The circuit is formed by the connection of the inductor to the parasitic capacitance of the covering. If one then selects the series inductance such that the resonant frequency of this additional resonant circuit has a suitable position relative to the passband of the filter or filters, then there is an improved attenuation in the stopband both in the vicinity of the passband as well as in the remote fly-back region. The inductance is advantageously set as a function of the existing parasitic capacitance to such a value that this tuned trap circuit is located in the stopband of the filter. By a series connection to the inductor, the existing parasitic capacitance forms a resonant circuit which constitutes a trap circuit to ground. If the filter arrangement comprises two filters, then the isolation between the two filters is improved in this way.

In another configuration, at least one additional electrical connection of the metal film to the ground terminal of the filter arrangement is made via an additional inductor in each case. It is possible in this way to form additional trap circuits that can differ in their resonant frequencies. Assuming that the capacitances that each individual bulk acoustic wave resonator forms with the metal film differ only insubstantially from one another, the different inductors in the different trap circuits are formed with differing absolute values.

In one configuration, the substrate is connected mechanically and electrically to the bulk acoustic wave resonator in a flip chip arrangement with the aid of bumps on the upper side of a carrier. On its underside, the carrier comprises at least one signal terminal and a ground terminal. These terminals are electrically connected via through hole contacts to an electrode of the filter or filters or to the metal film.

In such an arrangement, the covering can be applied over the back side of the substrate, can lie on top of the substrate, and seal it hermetically to the carrier laterally or around the latter.

It is possible to connect additional wiring or circuit elements to the filter with the aid of the carrier. In the present case, the inductor inserted in the ground connection of the metal film can be realized on or in the carrier.

The carrier then advantageously has a multilayer construction and has at least two dielectric layers and a metallization plane arranged therebetween. The circuit components and, in particular, the inductor are formed by structuring the metallization planes and connecting them in series with the ground terminal on the underside of the carrier. The inductor can be formed, for instance, as a meander-shaped printed conductor. It is sufficient, however, to form the inductor as an elongated printed conductor, the inductance value of which increases with increasing length. As a rule of thumb, the inductance amounts to ca. 0.10 to 0.15 nH per 100 μm length of printed conductor. In this way it is easily possible to form the inductance on or in the carrier with a value of ca. 1-2 nH.

It is possible to form the individual inductors with higher values and wire them to the connection in series. The decisive overall inductance is further reduced by the parallel connection of several ground connections. The decisive factor for the overall success of this measure is that the resultant overall inductance of the connections does not exceed a value of 2 nH per filter arrangement.

The filter arrangement can be constructed as a duplexer, then comprising a first and second filter formed on a common substrate or on separate substrates, but arranged on a common carrier with at least one bulk acoustic wave resonator each. The substrate or substrates with the two filters are covered from the back with a continuous covering.

The substrates are preferably mounted on the carrier in a flip chip arrangement. The covering preferably consists of a plastic laminate film that is formed in one or more layers and can be laminated onto the surface under pressure or heating over the backside of the substrate.

After lamination, a hermetic metal film can additionally be applied to the covering. For this purpose, the laminate is preferably removed in a strip-shaped frame-like region around the substrate, and the surface of the carrier is exposed. Then a thin film of titanium and/or copper can be sputtered on and subsequently galvanically thickened. It is also possible, however, to vapor-deposit the film, sputter it entirely, or to use other metals.

Since the size of the electrodes and thus the magnitude of the parasitic capacitance is variable only to a limited extent for a filter arrangement with a predetermined design, the inductance is preferably adjusted as a function of the given parasitic capacitance between the electrode and the metal film of the covering to a value that yields a resonant frequency between 3 and 6 GHz for the trap circuit. This is the optimal region for a filter arrangement with a passband between 1.5 and 2 GHz in order to maximize the isolation between the two individual filters and minimize the coupling between them.

The invention will be explained in detail below on the basis of embodiments and the associated figures. The figures serve only for illustration of the invention and are therefore drawn only schematically and not to scale. Identical parts are labeled with identical reference characters.

DETAILED DESCRIPTION

Figure 1:
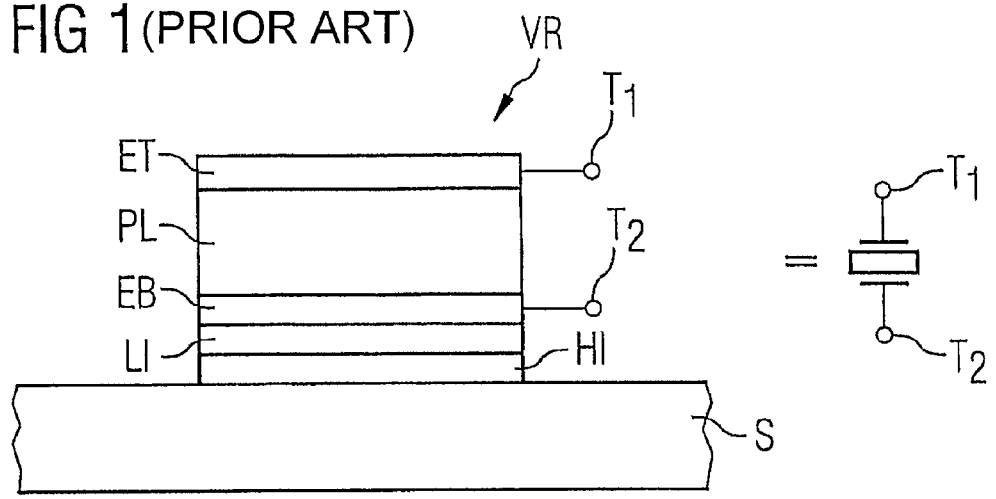
FIG. 1 shows a conventional bulk acoustic wave resonator (FBAR resonator) in schematic cross section.

FIG. 1 shows a conventional bulk acoustic wave resonator in schematic cross section. It consists in principle of a piezoelectric layer PL of, for example, aluminum nitride or zinc oxide. An upper electrode ET and a lower electrode EB are arranged on the two sides of the piezoelectric layer; they consist, for instance, of metals such as molybdenum, tungsten or tantalum with high acoustic impedance, defined as the square root of the product of elastic rigidity and density, or of metals and metal alloys (such as aluminum or aluminum-copper) with high electrical conductivity, or of layered combinations thereof. A bulk acoustic wave is generated in piezoelectric layer PL via the electrodes, which are connected to terminals T1, T2.

In order to keep the acoustic energy inside the desired layers inside the bulk acoustic wave resonator VR, whose oscillation frequency is defined by its overall thickness, an acoustic mirror can be provided underneath the resonator, as shown in the figure. This mirror consists of an alternating arrangement of layers LI with low acoustic impedance and layers HI with high acoustic impedance. While the low-impedance layers LI are formed, for example, from silicon oxide or plastic, the high-impedance layers HI preferably consist of heavy metals such as molybdenum or tungsten. All of this is formed on substrate S, on which the individual layers are deposited by thin-film technology over the entire surface and one above the other. The structuring can be done individually for each layer or for a part the layers. It is possible, for instance, to structure lower electrode EB together with high-impedance and low-impedance layers LI, HI of the acoustic mirror after the production of lower electrode EB. Piezoelectric layer PL can be arranged over the entire surface and does not necessarily require structuring. Upper electrode ET is structured as well and can be used, just like lower electrode EB, to interconnect several bulk acoustic wave resonators VR arranged side by side. The electric circuit symbol for a resonator is shown to the right of the cross section.

Figure 2:
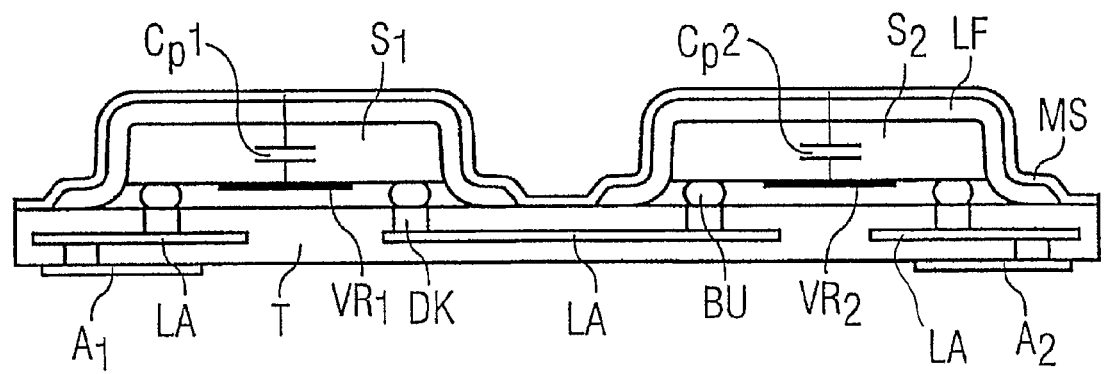
FIG. 2 shows two substrates with bulk acoustic wave resonators arranged on a carrier in schematic cross section.

FIG. 2 shows a finished component, in which two substrates S1, S2 with bulk acoustic wave resonators arranged on each are mounted in a flip-chip arrangement via bumps BU on a carrier T. Via the bumps, there is simultaneously a connection via through-hole contacts to corresponding contact surfaces on the upper side of the carrier, which are in turn connected via through-hole contacts DK to printed conductor sections LA of a metallization plane in the interior of the carrier and via additional through-hole contacts to external contacts A1, A2 of the entire component or filter. The back side of substrates S is covered with a laminate film LF that seals to the carrier around each substrate. In an area surrounding each substrate S1 and S2, which can cut out the area between the substrates in another embodiment, laminate film LF is removed and the surface of carrier T is exposed in this area. On top of laminate film LF and over the entire surface, a metal film MS is subsequently applied, which seals to the carrier in the strip-shaped area in which its surface is exposed. Thus, metal film MS completely seals off bulk acoustic wave resonators VR1, VR2 arranged on substrates S against the outside.

A suitable interconnection of the two substrates, or of the filter circuits or filters comprising bulk acoustic wave resonators arranged thereon, is arranged in the carrier, which is constructed of two layers here. Carrier T here comprises two dielectric layers, between which a structured metallization plane is formed. Printed conductor sections LA serving for electrical connection or interconnection, for example, are formed in the metallization plane. Printed conductor sections LA are in turn connected via additional through-hole contacts to external terminals A1, A2 on the underside of carrier T. The device can comprise more than the two terminals shown, and each substrate is then likewise connected to the carrier via more than two bumps.

A parasitic capacitance CP1, CP2 is formed between electrodes EB, ET of the bulk acoustic wave resonator and metal film MS which lies against the back side of substrates S. The parasitic capacitance between lower electrode EB, situated close to the substrate, and metal film MS is particularly crucial. If several bulk acoustic wave resonators are realized on one substrate S, a parasitic capacitance can form between each electrically isolated electrode section and metal film MS.

Figure 3:
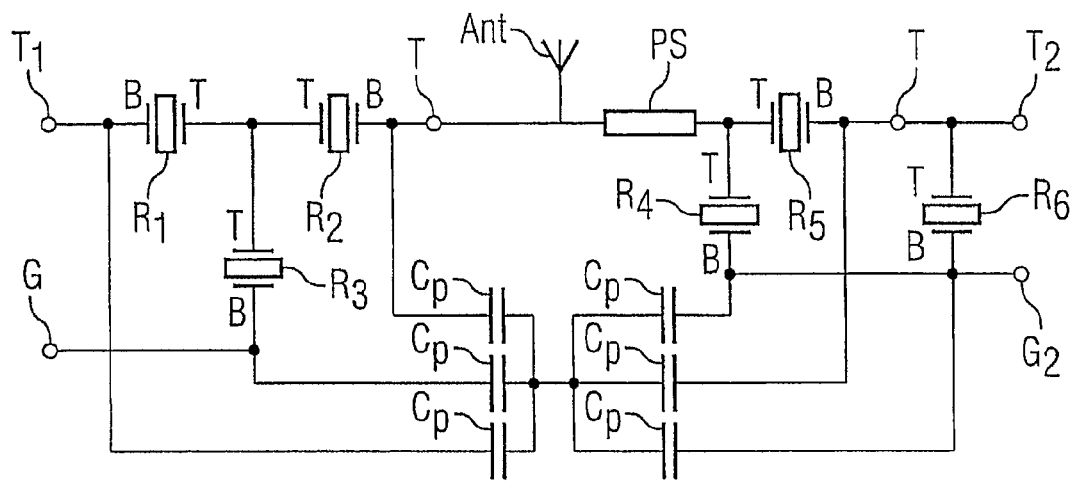
FIG. 3 shows a schematic circuit diagram of a duplexer constructed from bulk acoustic wave resonators.

FIG. 3 presents a schematic circuit diagram for the production of two filter circuits, in this case a duplexer that consists of a first filter, comprising resonators R1 R3, and a second filter, comprising resonators R4 R6. In the first filter, shown at the left in the figure, a first resonator R1 and a second resonator R2 are also connected in series between a first terminal T1 and an antenna ANT. A third resonator R3 is connected to a ground terminal G in parallel with this series circuit. In the circuit diagram, each side of the resonators is furnished with the letter B (bottom) or T (top), from which it is evident whether one is dealing with an upper electrode ET or a lower electrode EB. The right hand filter consists of a single series resonator R5 that is connected between the antenna and a second terminal T2. On both sides of this resonator R5, parallel branches, in which a resonator R4, R6 is arranged, respectively, are connected to a ground terminal G2. Additionally, a phase shifter PS, which separates the two filters by shifting the phase to prevent the signals from one filter from impairing the function of the other, is inserted between the antenna and the second filter.

A parasitic capacitance CP is formed between each electrode EB and the metal film, so that a total of six parasitic capacitances CP that have a common electrode via metal film MS appear in the illustrated conventional duplexer.

The two filters are capacitively coupled to one another via these capacitances, so that crosstalk occurs, which interferes with the signals in the respective other filter and leads to an elevated noise level, even to the point of completely obscuring the useful signals.

Figure 4:
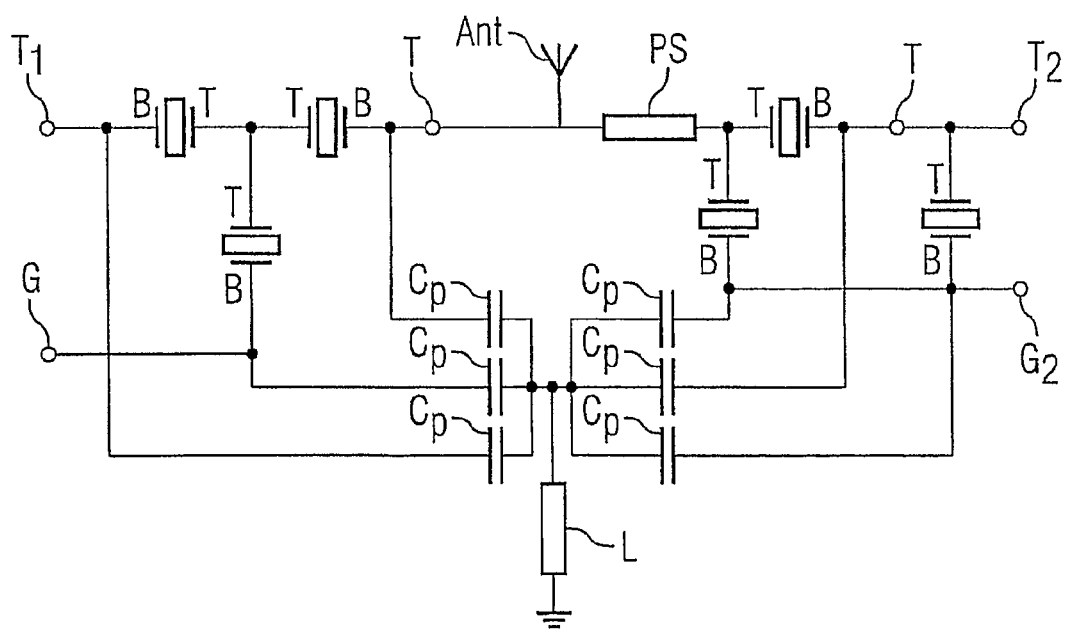
FIG. 4 shows a duplexer furnished with a series inductor, in schematic cross section.

FIG. 4 shows how, with the aid of grounded inductor L, a resonant circuit that improves the isolation of the duplexer is created from the coupled capacitances Cp together with the inductor. Although only one inductor L is illustrated in the figure, the metal film can be grounded via several connections and series inductors contained therein. By a suitable selection of inductance values, it is possible in this way to produce different trap circuits to ground, each having different resonant frequencies. With these resonant frequencies, an improved electrical isolation of the TX and RX paths results, which is improved by more than 20 dB in the fly back region for the illustrated FBAR duplexer. With a suitable selection of the resonant frequencies in the region between 3 and 6 GHz, the isolation between the two filters of the illustrated duplexer is additionally improved by approximately 15 dB in the passbands of the Tx and Rx filters. In some embodiments, a duplexer is therefore obtained that is substantially improved compared with known duplexers with regard to its isolation and stopband suppression.

Figure 5:
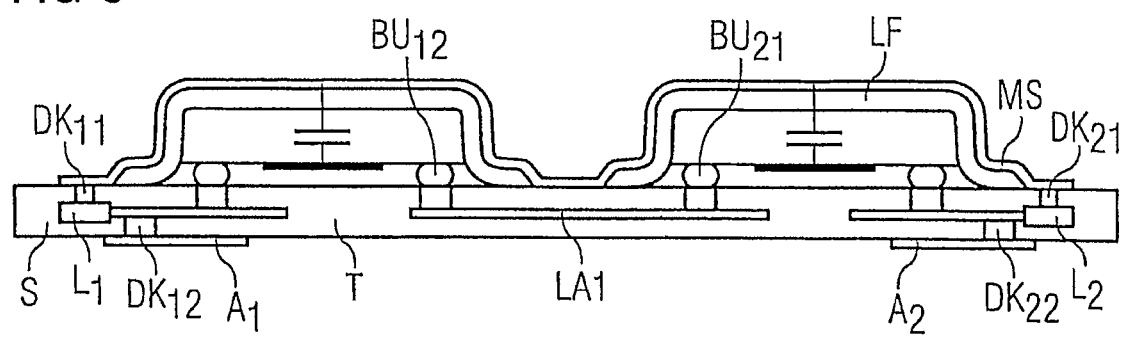
FIG. 5 shows a filter arrangement with two substrates furnished with bulk acoustic wave resonators on a carrier in which the connection comprising a series inductor is integrated.

FIG. 5 shows, on the basis of a schematic cross section through a duplexer that has a ground connection of the metal film with a series inductor L in the inventive manner, how the additional inductor L can be integrated in carrier T of the component or filter arrangement. While metal layer MS in FIG. 2 is electrically insulated, it is connected in the inventive component or in the inventive filter arrangement via a contact surface on the upper side of the carrier, which can simultaneously be the surface of a through-hole contact, to a circuit in the interior of the carrier. Via a through-hole contact DK11, DK21, metal film MS is connected to an inductor L1, L2 and in series with an external terminal A1, A2 arranged on the underside of the carrier.

The two inductors L1, L2 illustrated here are realized, for example, as elongated and, in particular, as conductor sections formed in a meander shape in the metallization plane of the carrier, realized here with two layers. Not shown is phase shifter PS, arranged for instance in conductor section LA1, which connects the two bumps BU12 and BU21 to one another. The antenna can also be connected via conductor section LA1. Additional terminals, through-hole contacts and conductor sections are not covered in the illustrated cross section, but are contained in an arbitrary or necessary number in the filter arrangement.

Although the invention was explained only on the basis of a few example embodiments, it is not limited thereto. The invention can be used with all filter arrangements that comprise at least two bulk acoustic wave resonators that are potentially capacitively coupled by an adjacent continuous metal film and thereby undesirably connected to one another. The additional advantages already mentioned are obtained with the invention for a duplexer constructed as shown for the sake of example.

The invention can also be transferred to filter arrangements that have more than two filters arranged on one or more substrates. The invention is therefore not limited to filter arrangements with two filters that are constructed as duplexers. The invention can also be used for 2-in-1 filters or for diplexers. Even inside a single filter with several bulk acoustic wave resonators, the invention brings advantages, due to an improvement of the isolation between input and output ports of the dual-port filter.

The invention claimed is:

1. An arrangement comprising:
a substrate comprising one of a dielectric substrate and a semiconductive substrate;
a first bulk acoustic wave resonator comprising a first electrode and a second electrode, wherein the first bulk acoustic wave resonator is on the substrate;
a second bulk acoustic wave resonator comprising a third electrode and a fourth electrode, wherein the second bulk acoustic wave resonator is on the substrate,
a filter comprising at least one of the first and the second bulk acoustic wave resonators; and
a large-surface covering comprising a metal layer over the substrate, the metal layer connected to a ground terminal, and an inductor between the metal layer and the ground terminal that forms an electrical connection between the metal layer and the ground terminal;
wherein:
a parasitic capacitance is formed between at least one of the first and second electrodes and the metal layer;
the parasitic capacitance and the inductor form a trap circuit to ground, and
the inductor is configured such that a resonant frequency of the trap circuit is in a stopband of the filter.

2. The arrangement of claim 1, further comprising an additional inductor between the metal layer and the ground terminal that forms an additional electrical connection between the metal layer and the ground terminal.

3. The arrangement of claim 2, wherein the inductor has an inductance value and the additional inductor has an inductance value, the inductance value of the inductor being different from the inductance value of the additional inductor.

4. The arrangement of claim 1, further comprising:
a carrier having an upper side and an underside, the carrier comprising a signal terminal and a ground terminal on the underside of the carrier; wherein:
the substrate is mounted in a flip-chip arrangement on the upper side of the carrier,
the signal terminal is connected by a through-hole contact to the first or second bulk acoustic wave resonator; and
the ground terminal is connected by a through-hole contact to the first or second bulk acoustic wave resonator or the metal layer.

5. The arrangement of claim 4, wherein:
the carrier comprises at least a first dielectric layer, a second dielectric layer, and a metallization plane between the first and second dielectric layers, and
the inductor formed by metallization in an interior of the carrier.

6. The arrangement of claim 1, wherein the arrangement further comprises a duplexer, the duplexer comprising:
a first filter on the substrate, the first filter comprising the first bulk acoustic wave resonator or the second bulk acoustic wave resonator; and
a second filter;
wherein the second filter is either on the substrate or on a second substrate that is separate from the substrate.

7. The arrangement of claim 6, wherein:
the second filter is on a second substrate that is separate from the first substrate; and
the first and second substrates are arranged on a common carrier and covered with a continuous covering.

8. The arrangement of claim 7 wherein the continuous covering comprises a plastic laminate film coated on an exterior with the metal layer.

9. The arrangement of claim 1, wherein the inductor has a value of about 1-2 nH.

10. The arrangement of claim 1, wherein the arrangement is configured such that an inductance of all parallel connections between the metal layer and the ground terminal has a value of less than about 2 nH.

11. The arrangement of claim 1, wherein the inductance of the inductor is based on a parasitic capacitance between one or more of the first, second, third and fourth electrodes and the metal layer such that the resonant frequency of the trap circuit is between about 3 and about 6 GHz.

12. The arrangement of claim 1,
wherein the filter comprises a plurality of bulk acoustic wave resonators on the substrate and electrically interconnected via structured electrode layers in a ladder-type or a lattice-type arrangement.

13. The arrangement of claim 12 wherein the first and second bulk acoustic wave resonators comprises FBAR resonators.

* * * * *